(12) United States Patent
Nemani et al.

(10) Patent No.: US 9,911,594 B2
(45) Date of Patent: *Mar. 6, 2018

(54) SELECTIVE ATOMIC LAYER DEPOSITION PROCESS UTILIZING PATTERNED SELF ASSEMBLED MONOLAYERS FOR 3D STRUCTURE SEMICONDUCTOR APPLICATIONS

(71) Applicant: Applied Materials, Inc., Santa Clara, CA (US)

(72) Inventors: Srinivas D. Nemani, Sunnyvale, CA (US); Ellie Y. Yieh, San Jose, CA (US); Ludovic Godet, Sunnyvale, CA (US); Yin Fan, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/346,306

(22) Filed: Nov. 8, 2016

(65) Prior Publication Data

US 2017/0053797 A1 Feb. 23, 2017

Related U.S. Application Data

(63) Continuation of application No. 14/276,780, filed on May 13, 2014, now Pat. No. 9,515,166.

(Continued)

(51) Int. Cl.
*H01L 21/31* (2006.01)
*H01L 21/02* (2006.01)
(Continued)

(52) U.S. Cl.
CPC .. *H01L 21/02304* (2013.01); *H01J 37/32357* (2013.01); *H01J 37/32403* (2013.01);
(Continued)

(58) Field of Classification Search
None
See application file for complete search history.

(56) References Cited

U.S. PATENT DOCUMENTS 5,885,425 A 3/1999 Hsieh et al.
7,683,447 B2 3/2010 Wang et al.
(Continued)

FOREIGN PATENT DOCUMENTS

JP 5353101 B2 11/2013

OTHER PUBLICATIONS

PCT Search Report for PCT/US2015/017078 dated May 29, 2015, 13 pgs.

*Primary Examiner* — Cory Eskridge
(74) *Attorney, Agent, or Firm* — Patterson + Sheridan, LLP

(57) ABSTRACT

Methods for forming fin structure with desired materials formed on different locations of the fin structure using a selective deposition process for three dimensional (3D) stacking of fin field effect transistor (FinFET) for semiconductor chips are provided. In one embodiment, a method of forming a structure with desired materials on a substrate includes forming a patterned self-assembled monolayer on a circumference of a structure formed on a substrate, wherein the patterned self-assembled monolayer includes a treated layer formed among a self-assembled monolayer, and performing an atomic layer deposition process to form a material layer predominantly on the self-assembled monolayer from the patterned self-assembled monolayer.

6 Claims, 11 Drawing Sheets

Related U.S. Application Data

(60) Provisional application No. 61/978,071, filed on Apr. 10, 2014.

(51) Int. Cl.
  *H01L 29/66* (2006.01)
  *H01L 21/3115* (2006.01)
  *H01J 37/32* (2006.01)

(52) U.S. Cl.
  CPC .... *H01J 37/32422* (2013.01); *H01L 21/0228* (2013.01); *H01L 21/0234* (2013.01); *H01L 21/02321* (2013.01); *H01L 21/31155* (2013.01); *H01L 29/66795* (2013.01); *H01L 29/66803* (2013.01)

(56) References Cited

U.S. PATENT DOCUMENTS

| | | | |
|---|---|---|---|
| 7,732,329 B2 * | 6/2010 | Vasilev | H01L 21/321 |
| | | | 257/E21.476 |
| 7,767,977 B1 | 8/2010 | Godet et al. | |
| 7,888,653 B2 | 2/2011 | Kellerman et al. | |
| 8,101,510 B2 | 1/2012 | Godet et al. | |
| 9,515,166 B2 * | 12/2016 | Nemani | H01L 21/0228 |
| 2003/0064607 A1 * | 4/2003 | Leu | C23C 16/02 |
| | | | 438/780 |
| 2005/0153547 A1 | 7/2005 | Barns | |
| 2009/0269642 A1 | 10/2009 | Risen, Jr. et al. | |
| 2012/0052681 A1 * | 3/2012 | Marsh | C23C 16/0227 |
| | | | 438/680 |
| 2012/0135273 A1 | 5/2012 | Horng et al. | |
| 2012/0135543 A1 | 5/2012 | Shin et al. | |
| 2014/0038311 A1 | 2/2014 | Kim et al. | |

* cited by examiner

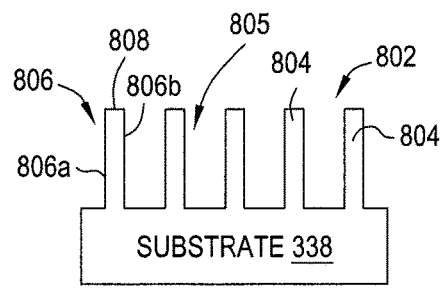
FIG. 8A
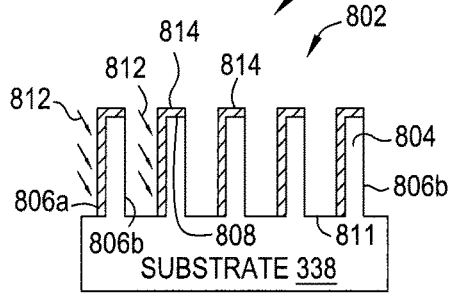
FIG. 8B2-1
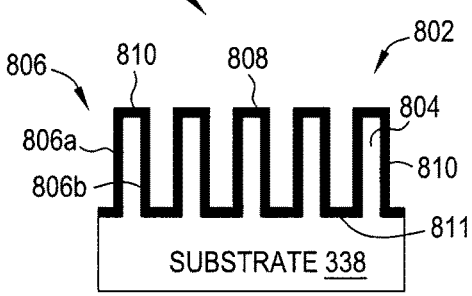
FIG. 8B1
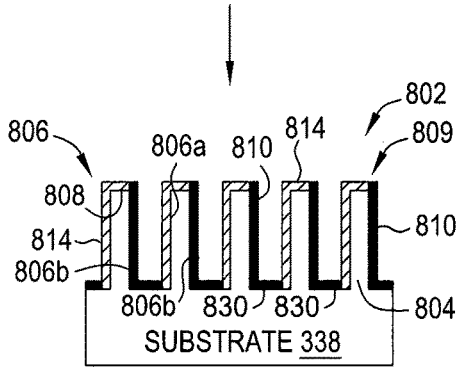
FIG. 8C2-1
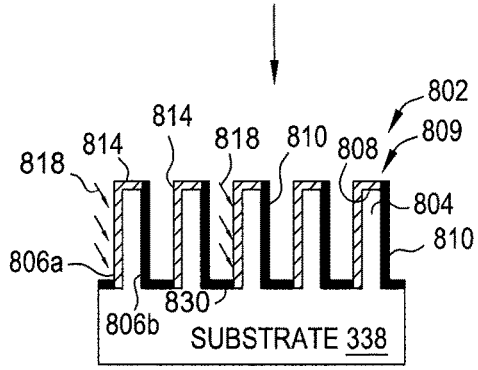
FIG. 8C1-1
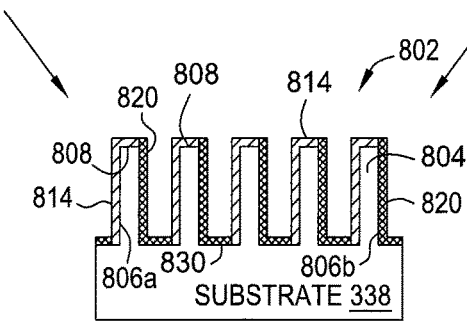
FIG. 8D1

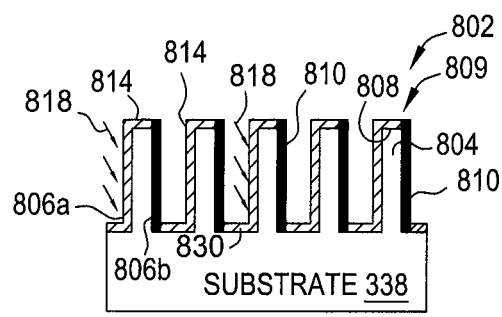
FIG. 8C1-2
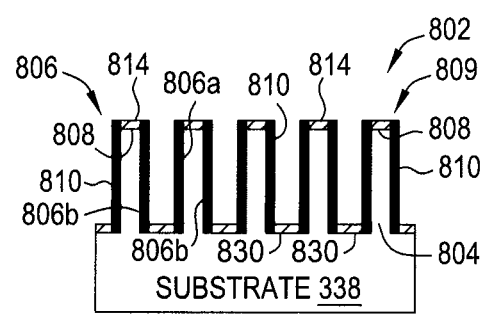
FIG. 8C1-3
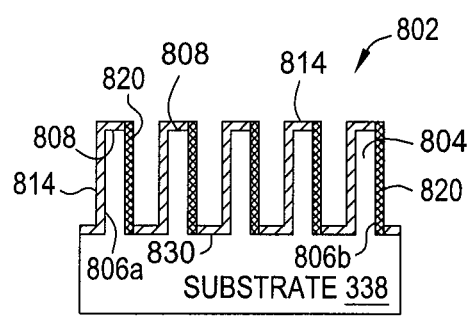
FIG. 8D2
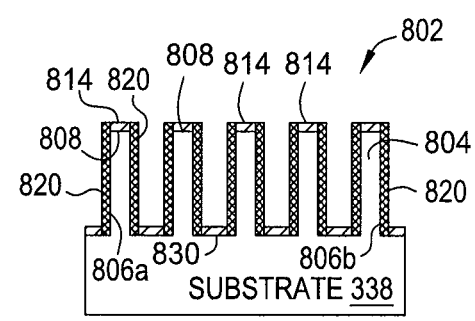
FIG. 8D3

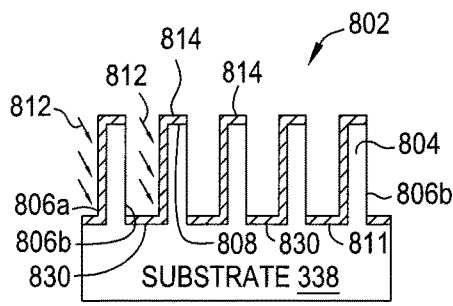
FIG. 8B2-2
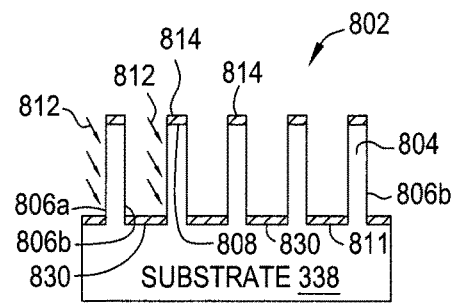
FIG. 8B2-3
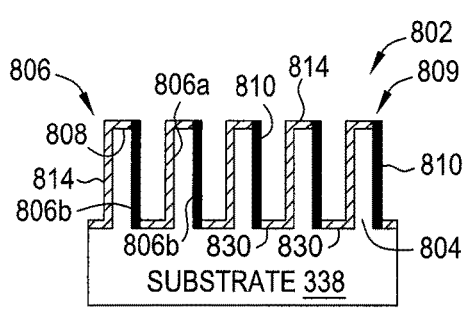
FIG. 8C2-2
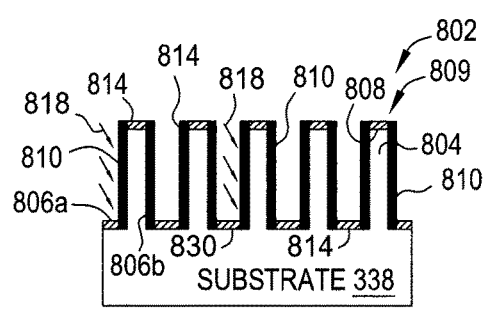
FIG. 8C2-3
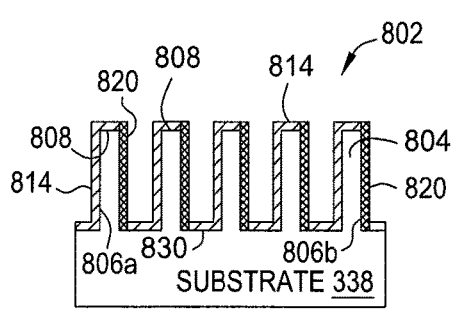
FIG. 8D4
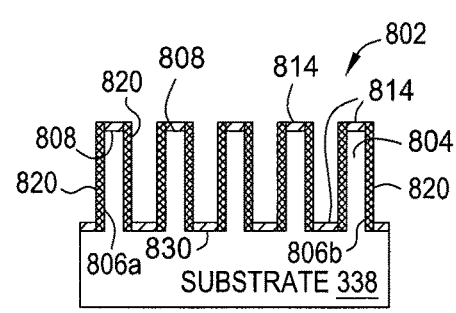
FIG. 8D5

SELECTIVE ATOMIC LAYER DEPOSITION PROCESS UTILIZING PATTERNED SELF ASSEMBLED MONOLAYERS FOR 3D STRUCTURE SEMICONDUCTOR APPLICATIONS

CROSS-REFERENCE TO RELATED APPLICATIONS

This application is a continuation of U.S. patent application Ser. No. 14/276,780, which claims benefit of U.S. Provisional Application Ser. No. 61/978,071 filed Apr. 10, 2014, which are incorporated by reference in their entireties.

BACKGROUND

Field

Embodiments generally relate to methods for forming three dimension structures with desired materials on a semiconductor substrate. More specifically, embodiments relate to methods for forming three dimension structures on a semiconductor substrate with different materials at different locations of the structure by a selective atomic layer deposition process utilizing patterned self assembled monolayers and a directional plasma process for fin field effect transistor (FinFET) semiconductor manufacturing applications.

Description of the Related Art

Reliably producing sub-half micron and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI technology have placed additional demands on processing capabilities. Reliable formation of gate structures on the substrate is important to VLSI and ULSI success and to the continued effort to increase circuit density and quality of individual substrates and die.

As circuit densities increase for next generation devices, the widths of interconnects, such as vias, trenches, contacts, gate structures and other features, as well as the dielectric materials therebetween, decrease to 45 nm and 32 nm dimensions, whereas the thickness of the dielectric layers remain substantially constant, with the result of increasing the aspect ratios of the features. In order to enable the fabrication of next generation devices and structures, three dimensional (3D) stacking of features in semiconductor chips is often utilized. In particular, fin field effect transistors (FinFET) are often utilized to form three dimensional (3D) structures in semiconductor chips. By arranging transistors in three dimensions instead of conventional two dimensions, multiple transistors may be placed in the integrated circuits (ICs) very close to each other. Recently, complementary metal oxide semiconductor (CMOS) FinFET devices have been widely used in many logic and other applications and are integrated into various different types of semiconductor devices. FinFET devices typically include semiconductor fins with high aspect ratios in which the channel and source/drain regions for the transistor are formed thereover. A gate electrode is then formed over and along side of a portion of the fin utilizing the advantage of the increased surface area of the channel and source/drain regions to produce faster, more reliable and better-controlled semiconductor transistor devices. Further advantages of FinFETs include reduced short channel effect and higher current flow.

FIG. 1A depicts an exemplary embodiment of a fin field effect transistor (FinFET) 150 disposed on a substrate 100. The substrate 100 may be a silicon substrate, a germanium substrate, or a substrate formed from other semiconductor materials. In one embodiment, the substrate 100 may include p-type or n-type dopants doped therein. The substrate 100 includes a plurality of semiconductor fins 102 formed thereon isolated by shallow trench isolation (STI) structures 104. The shallow trench isolation (STI) structures 104 may be formed by an insulating material, such as a silicon oxide material, a silicon nitride material or a silicon carbon nitride material.

The substrate 100 may include a portion in NMOS device region 101 and a portion in PMOS device region 103 as needed, and each of the semiconductor fins 102 may be sequentially and alternatively formed in the NMOS device region 101 and the PMOS device region 103 in the substrate 100. The semiconductor fins 102 are formed protruding above the top surfaces of the shallow trench isolation (STI) structures 104. Subsequently, a gate structure 106, typically including a gate electrode layer disposed on a gate dielectric layer, is deposited on both of the NMOS device region 101 and the PMOS device region 103 and over the semiconductor fins 102.

The gate structure 106 may be patterned to expose portions 148, 168 of the semiconductor fins 102 uncovered by the gate structure 106. The exposed portions 148, 168 of the semiconductor fins 102 may then be doped with dopants to form lightly doped source and drain (LDD) regions using an implantation process.

FIG. 1B depicts a cross sectional view of the substrate 100 including the plurality of semiconductor fins 102 formed on the substrate 100 isolated by the shallow trench isolation (STI) structures 104. The plurality semiconductor fins 102 formed on the substrate 100 may be part of the substrate 100 extending upwards from the substrate 100 utilizing the shallow trench isolation (STI) structures 104 to isolate each of the semiconductor fins 102. In another embodiment, the semiconductor fins 102 may be individually formed structures disposed on the substrate 100 that are made from materials different than the substrate 100 using suitable techniques available in the art. In the embodiment wherein different materials of the semiconductor fins 102 are required to be formed on different surfaces 120, including a first sidewall 120a and a second side wall 120b connected by a top surface 110, additional process steps may be performed to alter the materials of the semiconductor fins 102 formed on the different surfaces 120 of the semiconductor fins 102.

A conventional method for selective deposition may be performed to locally form a material layer on only certain locations of a planer surface on a substrate made from a material different than the substrate material. FIG. 2A-2C depict an existing process utilized to perform the deposition process. The process utilizes self assembled monolayers (SAM) as a surface modification layer to selectively modify surface properties of the different surface materials, exposed on the substrate. For example, a substrate 202 may include a feature 204 formed from a first material (e.g., a silicon oxide layer) disposed on the substrate 202 formed from a second material (e.g., silicon), as shown in FIG. 2A. The feature 204 has an opening 208 defined therein exposing a surface 206 of the substrate 202. Self assembled monolayers (SAM) 210 may then be formed on the substrate 202 by a solution based precursor, as shown in FIG. 2B. Generally, the self assembled monolayer (SAM) 210 may only be formed on the surface that has chemical reaction capability with the molecules from the self assembled monolayer (SAM) 210. In the embodiment depicted in FIG. 2B, the precursor utilized to form the self assembled monolayer (SAM) 210 is selected to only chemically react with a surface 212 of the feature 204, (e.g., a silicon oxide material), rather than the surface 206 of the substrate 202 (e.g., a silicon material). By doing so, the self assembled monolayers (SAM) 210 may be predominantly formed on the feature 204 on the substrate 202, leaving the surface 206 of the substrate 202 free of self assembled monolayers (SAM) 210. Subsequently, an atomic layer deposition (ALD), which is a process highly sensitive to surface conditions, having selected precursors, is then performed to form a structure 214 selectively on the designated surface 206 of the substrate 202, as shown in FIG. 2C.

By utilizing the self assembled monolayers (SAM) 210 formed the features 204, the structure 214 may be formed selectively on only designated surface 206 of the substrate 202. However, in cases when a substrate only contains one type of material, the self assembled monolayer (SAM) 210 may be globally formed on the entire surface of such substrate, thereby making the selective material deposition difficult to achieve. In other words, in the case wherein a structure on a substrate is formed by a single type of material, selective deposition via utilization of the self assembled monolayers (SAM) may not be successfully enabled, as the self assembled monolayer (SAM) is to be globally applied across without selectivity. For example, the fin structure 102 as depicted in FIG. 1B may be formed by one type of material. However, when only one type of material is desired to be selectively formed only on one side wall or one top or bottom surface, either the first sidewall 120a, top surface 110 or the second sidewall 120b of the fin structure 102, utilization of the self assembled monolayer (SAM) may not be successful as the self assembled monolayer (SAM) may globally formed on the whole outer surface 120 of the fin structure 102 without selectivity.

Thus, there is a need for improved methods for a selective deposition process suitable for three dimensional (3D) stacking of semiconductor chips or other semiconductor devices.

SUMMARY

Methods for depositing desired materials formed on different locations of the fin structure using a selective deposition process for three dimensional (3D) stacking of fin field effect transistor (FinFET) for semiconductor chips are provided. In one embodiment, a method of forming a structure with desired materials on a substrate includes forming a patterned self-assembled monolayer on a circumference of a structure formed on a substrate, wherein the patterned self-assembled monolayer includes a treated layer formed among a self-assembled monolayer, and performing an atomic layer deposition process to form a material layer predominantly on the self-assembled monolayer from the patterned self-assembled monolayer.

In another embodiment, a method of forming a fin structure with different materials on different sidewalls on a substrate includes forming a self-assembled monolayer exclusively on a first portion of a fin structure disposed on a substrate, and performing an atomic layer deposition process to selectively form a material layer predominantly on the self-assembled monolayer, leaving a second portion of the fin structure free of the material layer.

In yet another embodiment, a method for forming a fin structure with different materials formed on different locations of the fin structure includes performing an atomic layer deposition process to form a material layer on a substrate having a patterned self-assembled layer formed on a fin structure, wherein material layer is selectively formed a designated location of the fin structure where the patterned self-assembly defines to grow.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 8A-8D5 depict one embodiment of a sequence for forming form fin structures with desired materials during the manufacturing process according to the process depicted in FIG. 7.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Methods for selectively depositing different materials at different locations on a structure formed on the substrate are provided. The structure may include a fin structure, a gate structure, a contact structure, or any suitable structure in semiconductor devices, particularly for three dimensional (3D) stacking of fin field effect transistor (FinFET) semiconductor structures. In one embodiment, a selective deposition process may be utilized to form different materials on different surfaces, e.g., different portions of a structure by utilizing patterned self assembled monolayers. The patterned self assembled monolayers (SAM) serve as an initiation layer on the surface of the substrate. An atomic layer deposition process to selectively deposit a material layer on a designated region of the patterned self assembled monolayers (SAM). The patterned self assembled monolayers (SAM) may be formed by utilizing ion doping or directional plasma process which dopes ions with angles into the designated regions of the self assembled monolayers (SAM) formed on the structure. The ions modify surface properties of a portion of the self assembled monolayers (SAM), forming the patterned self assembled monolayers (SAM) to enable the subsequent selective deposition process.

Figure 3A:
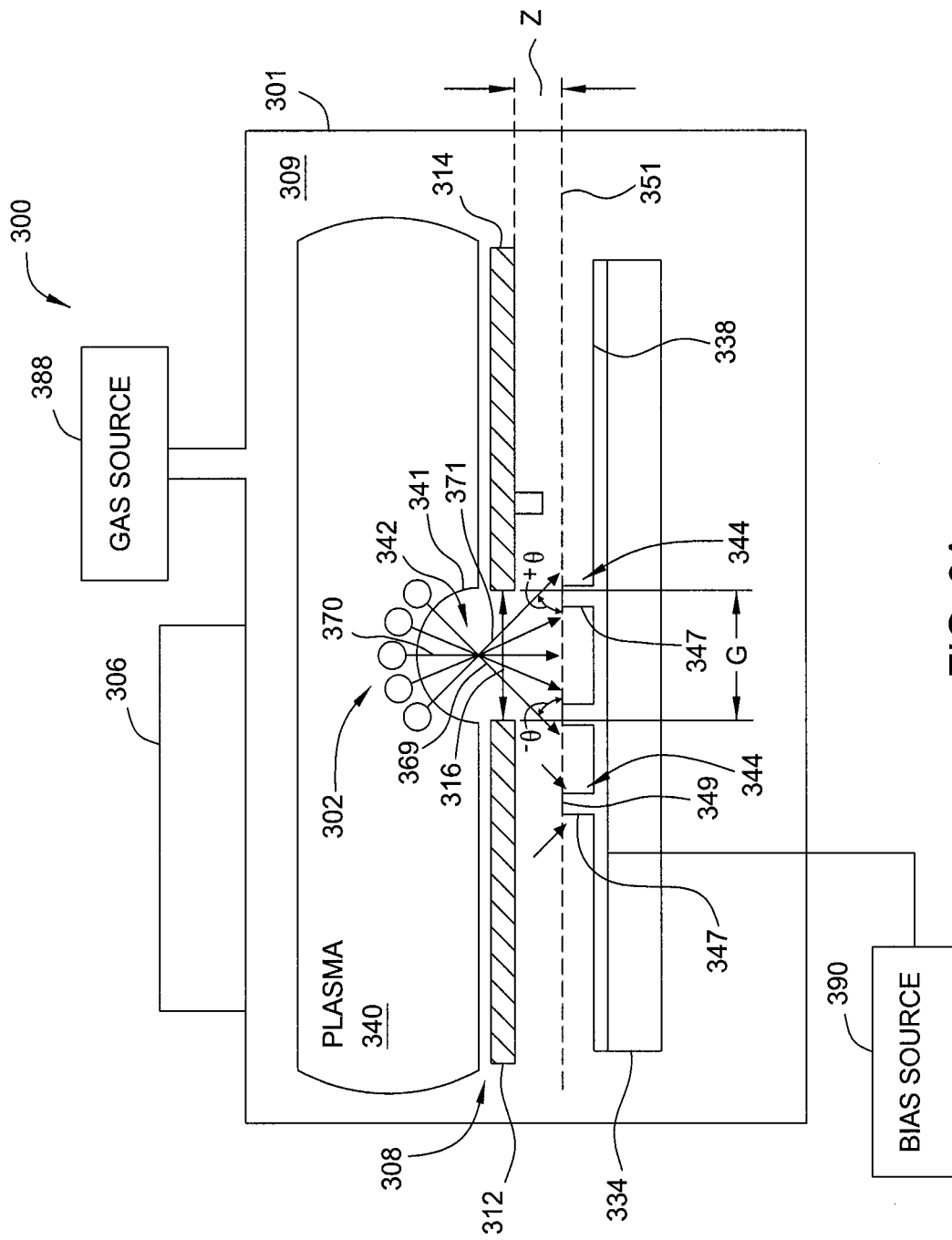
FIG. 3A depicts an apparatus which may be utilized to dope dopants in a structure on a substrate.

FIG. 3A is a sectional view of one embodiment of a processing chamber 300 suitable for doping dopants into a substrate. Suitable processing chambers that may be adapted for use with the teachings disclosed herein include, for example, a processing chamber available from Applied Materials, Inc. of Santa Clara, Calif. Although the processing chamber 300 is shown having a plurality of features that enable ion doping performance, it is contemplated that other processing chambers from other manufactures may also be adapted to benefit from one or more of the inventive features disclosed herein. The processing chamber 300 as described herein may be utilized as a plasma doping apparatus. However, the processing chamber 300 may also include, but not be limited to, etching and deposition systems. Furthermore, the plasma doping apparatus can perform many differing material modification processes on a substrate. One such process includes doping a substrate, such as a semiconductor substrate, with desired dopants.

The processing chamber 300 may include chamber body 301 defining an interior processing region 309. A substrate support 334 is disposed in the processing chamber 300. A substrate 338 having features 344 formed thereon may be disposed on the substrate support 334 during a directional plasma process. The substrate 338 may include, but not be limited to, a semiconductor wafer, flat panel, solar panel, and polymer substrate. The semiconductor wafer may have a disk shape with a diameter of 200 millimeters (mm), 300 millimeters (mm) or 450 millimeters (mm) or other size, as needed.

A RF plasma source 306 is coupled to the chamber body 310 and configured to generate a plasma 340 in the processing chamber 300. In the embodiment of FIG. 3A, a plasma sheath modifier 308 is disposed in the interior processing region 309. The plasma sheath modifier 308 includes a pair of modifier 312, 314 defining a gap 316 therebetween. The gap 316 defines a horizontal spacing (G). In some embodiments, the plasma sheath modifier 308 may include an insulator, conductor or semiconductor. The pair of modifiers 312, 314 may be a pair of sheets having a thin, flat shape. In other embodiments, the pair of modifiers 312, 314 may be other shapes such as tube shaped, wedge shaped, and/or have a beveled edge proximate the gap 316. In one embodiment, the modifiers 312, 314 may be fabricated of quartz, alumina, boron nitride, glass, polysilicon, silicon nitride, silicon carbide, graphite and the like.

In one embodiment, the horizontal spacing of the gap 316 defined by the pair of modifiers 312, 314 may be about 6.0 millimeters (mm). The pair of modifiers 312, 314 may also be positioned to define a vertical spacing (Z) above a plane 351. The plane 351 is defined by a front surface of the substrate 338 or a surface of the substrate support 334. In one embodiment, the vertical spacing (Z) may be about 3.0 mm.

A gas source 388 is coupled to the processing chamber 300 to supply an ionizable gas to the interior processing region 309. Examples of an ionizable gas include, but are not limited to, $BF_3$, $Bl_3N_2$, Ar, $PH_3$, $AsH_3$, $B_2H_6$, $H_2$, Xe, Kr, Ne, He, $SiH_4$, $SiF_4$, $SF_6$, $C_2F_6$, $CHF_3$, $GeH_4$, $GeF_4$, $CH_4$, $CF_4$, $AsF_5$, $PF_3$ and $PF_5$. The plasma source 306 may generate the plasma 340 by exciting and ionizing the gas provided to the processing chamber 300. Ions in the plasma 340 may be attracted across the plasma sheath 342 by different mechanisms. In the embodiment of FIG. 3A, a bias source 390 is coupled to the substrate support 334 configured to bias the substrate 338 to attract ions 302 from the plasma 340 across the plasma sheath 342. The bias source 390 may be a DC power supply to provide a DC voltage bias signal or an RF power supply to provide an RF bias signal.

It is believed that the plasma sheath modifier 308 modifies the electric field within the plasma sheath 342 to control a shape of the boundary 341 between the plasma 340 and the plasma sheath 342. The boundary 341 between the plasma 340 and the plasma sheath 342 may have a convex shape relative to the plane 351. When the bias source 390 biases the substrate 338, ions 302 are attracted across the plasma sheath 342 through the gap 316 defined between the modifiers 312, 314 through a large range of incident angles. For instance, ions 302 following trajectory path 371 may strike the substrate 338 at an angle of positive θ (+θ) relative to the plane 351. Ions following trajectory path 370 may strike perpendicularly on the substrate 338 at about an angle of about 90 degrees relative to the same plane 351. Ions following trajectory path 369 may strike the substrate 338 at an angle of negative θ (−θ) relative to the plane 351. Accordingly, the range of incident angles may be between about positive θ (+θ) and about negative θ (−θ), centered about 90 degrees. In addition, some ion trajectories paths such as paths 369 and 371 may cross each other. Depending on a number of factors including, but not limited to, the horizontal spacing (G) between the modifiers 312 and 314, the vertical spacing (Z) of the plasma sheath modifier 308 above the plane 351, the dielectric constant of the modifiers 312 and 314, and other plasma process parameters, the range of incident angles (θ) may be between +60 degree and −60 degree centered about 0 degree. Hence, small three dimensional structures on the substrate 338 may be treated uniformly by the ions 302. For example, sidewalls 347 of the feature 344, which may be utilized to form a fin structure for FINFET devices, having an exaggerated size for clarity of illustration, may be more uniformly treated by the ions 302, rather than just a top surface 349.

Figure 3B:
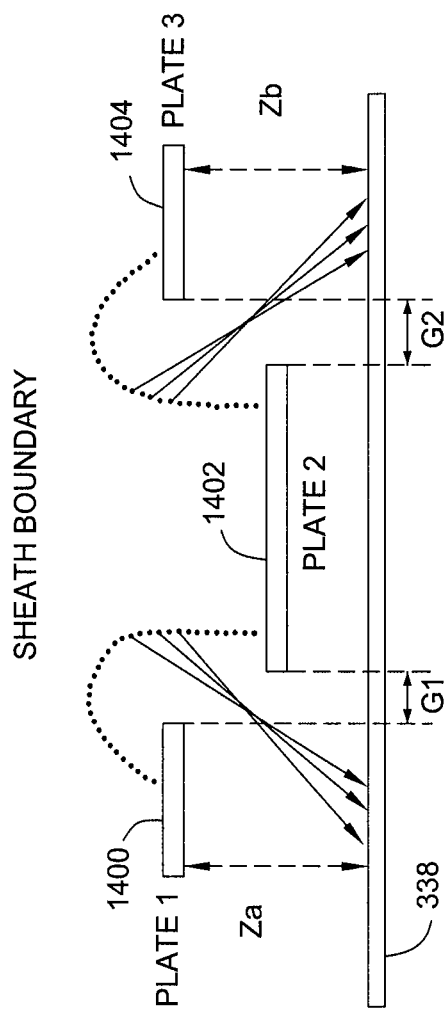
FIG. 3B depicts another embodiment of an apparatus to dope dopants in a structure on a substrate.

Referring to FIG. 3B, instead of a pair of modifiers 312, 314 depicted in FIG. 3A, at least three modifiers 1400, 1402, 1404 are used to control the ions with desired angular distribution to the substrate 338. By arranging the outer two modifiers 1400, 1404 on a common plane equally shaped a distance Za above the substrate 338, the same vertical plane (Za), and by maintaining equal horizontal spacing G1, G2 between the modifiers 1400, 1402, 1404, a symmetric bimodal angular spread of ions, centered about +/−θ (+θ and −θ) degrees may be obtained. As described above, the incidental angles ions doped onto the substrate 338 may be modified by varying the vertical spacing between the outer modifiers 1400, 1404 and the middle modifier 1402, so as to vary the gap angles. The angular ion spread can be modified by varying the horizontal spacing (G1, G2) between the modifiers 1400, 1402, 1404, so as to vary the gap width defined by the horizontal spacing (G1, G2). An asymmetric distribution can be created by making Za different than Zb, by choosing G1 different than G2, or a combination of both actions. In one embodiment, the angular ion spread can be modified from between about 0 degree and about 30 degrees from the center to only treat or implant ions into one side of a structure.

Figure 4:
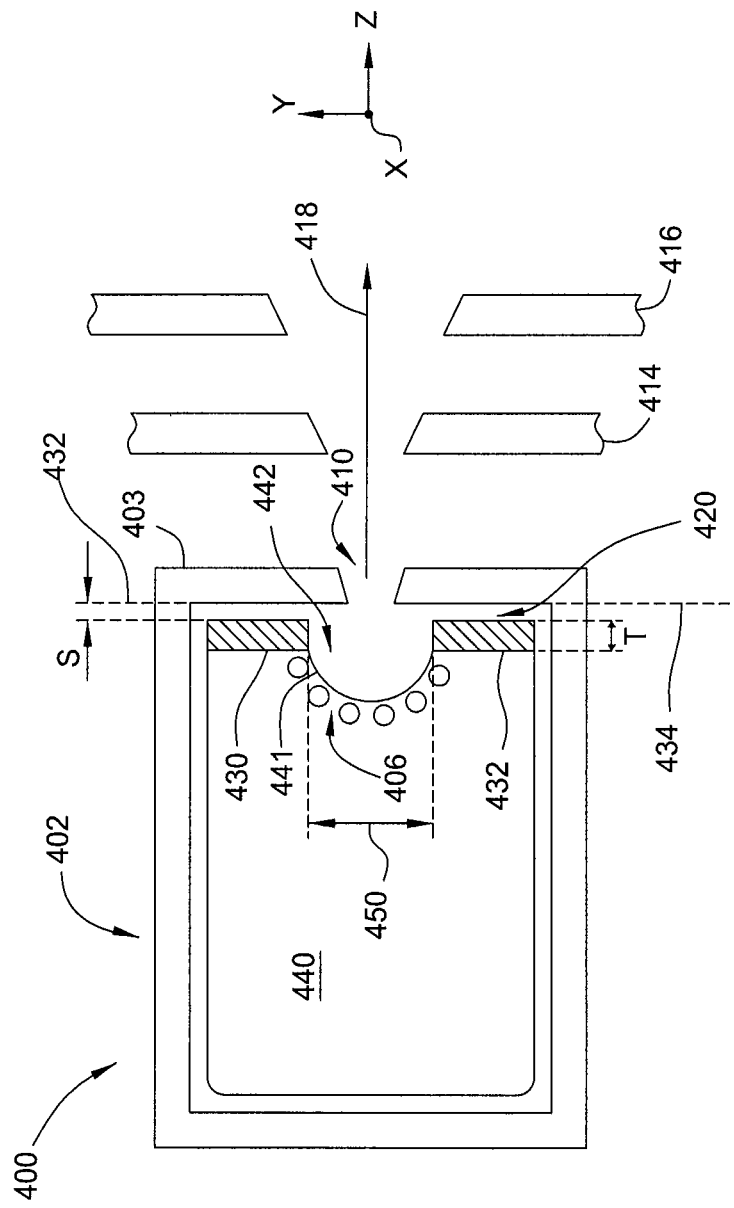
FIG. 4 depicts another embodiment of an apparatus which may be utilized to dope dopants in a structure on a substrate.

FIG. 4 depicts another embodiment of an ion processing chamber 400 that may be utilized to dope ions into a substrate with desired and variable incident angles. The processing chamber 400 includes an arc chamber 402 having a sidewall 403 with an extraction aperture 410. The processing chamber 400 further includes a plasma sheath modulator 420 to control a shape of a boundary 441 between the plasma 440 and the plasma sheath 442 proximate the extraction aperture 410. An extraction electrode assembly extracts ions 406 from the plasma 440 and accelerates them across the plasma sheath 442 to desired extraction energy of a well-defined ion beam 418. The extraction electrode assembly may include the sidewall 403 functioning as an arc slot electrode, a suppression electrode 414 and a ground electrode 416. The suppression electrode 414 and the ground electrode 416 each have an aperture aligned with the extraction aperture 410 for extraction of the well-defined ion beam 418. To aid with explanation, a Cartesian coordinate system is defined where the ion beam 418 travels in the Z direction. The X-Y plane is perpendicular to the Z direction which can change depending on the direction of the ion beam 418.

In the embodiment of FIG. 4, the plasma sheath modulator 420 includes a pair of modifiers 430, 432 positioned in the arc chamber 402. In other embodiments, the modulator 420 may include one modifier. The modifiers 430, 432 may be fabricated of quartz, alumina, boron nitride, silicon, silicon carbide, graphite, glass, porcelain, silicon nitride and the like. The pair of modifiers 430, 432 may be a pair of sheets having a thin, flat shape. In other embodiments, the pair of modifiers 430, 432 may be other shapes such as tube shaped, wedge shaped, and/or have a beveled edge. The pair of modifiers 430, 432 defines a gap 450 there between having spacing (G). The pair of modifiers 430, 432 may also be positioned a vertical spacing (S) above the plane 432 defined by an interior surface of the sidewall 403 having the extraction aperture 410.

In operation, a feed gas (not illustrated) is supplied to the arc chamber 402. Examples of a feed gas include, but are not limited to, $BF_3$, $Bl_3N_2$, Ar, $PH_3$, $AsH_3$, $B_2H_6$, $H_2$, Xe, $SF_6$, $C_2F_6$, $CHF_3$, Kr, Ne, He, $SiH_4$, $SiF_4$, $GeH_4$, $GeF_4$, $CH_4$, $CF_4$, $AsF_5$, $PF_3$ and $PF_5$. The feed gas may originate from a gas source or may be vaporized from a solid source depending on the desired species. The feed gas is ionized in the arc chamber 402 to generate plasma. Those skilled in the art will recognize differing types of ion sources that generate plasma in differing ways, such as an indirectly heated cathode (IHC) source, a Bernas source, a RF source, a microwave source, and an electron cyclotron resonance (ECR) source. An IHC source generally includes a filament positioned in close proximity to a cathode, and also includes associated power supplies. The cathode (not illustrated) is positioned in the arc chamber 402. As the filament is heated, electrons emitted by the filament are accelerated towards the cathode to provide for heating of the cathode. The heated cathode, in turn, provides electrons into the arc chamber that have ionizing collisions with the gas molecules of the feed gas to generate plasma.

An extraction electrode assembly including the sidewall 403, the suppression electrode 414 and the ground electrode 416 extracts ions 406 from the plasma 440 in the arc chamber 402 into the well-defined ion beam 418. The ions 406 are accelerated across the boundary 441 and the plasma sheath 442 through the gap 450 between the pair of modifiers 430, 432. The sidewall 403 functioning as an arc source electrode may be biased by a power supply to the same large potential as the arc chamber 402. The suppression electrode 414 may be biased at a moderately negative value to prevent electrons from entering back into the arc chamber 402. The ground electrode 415 may be at ground potential. The strength of the electric field generated by the electrode assembly may be tuned to achieve a desired beam current and energy.

Advantageously, the plasma sheath modulator 420 controls a shape of the boundary 441 between the plasma 440 and the plasma sheath 442 proximate the extraction aperture 410. To control the shape of the boundary 441 the plasma sheath modulator 420 modifies or influences the electric field within the plasma sheath 442. When the plasma sheath modulator 420 includes the pair of modifiers 430, 432, the boundary 441 may have a concave shape relative to the plasma 440 as illustrated in FIG. 4. Depending on a number of factors including, but not limited to, the horizontal spacing (G) between the modifiers 430, 432, the vertical spacing (S) of the modifiers 430, 432 above the plane of the substrate or substrate support, the material and thickness thereof of the modifiers 430, 432, and other process parameters of the ion source, the shape of the boundary 441 may be controlled.

The shape of the boundary 441 between the plasma 440 and the plasma sheath 442 together with the electric field gradients within the plasma sheath 442 control parameters of the ion beam. For example, the angular spread of the ions 406 can be controlled to assist with ion beam focusing. For instance, with the boundary 441 having a concave shape relative to the plasma, there is a large angular spread of ions accelerated across the boundary to assist with beam focusing. In addition, the ion beam current density of the ion beam 418 can also be controlled. For example, compared to the boundary 441 of one conventional ion source, the boundary 441 has a larger area to extract additional ions. Hence, the additional extracted ions contribute to an increased ion beam current density. Accordingly, with all other parameters being equal, the shape of the boundary 441 can provide a focused ion beam with a high ion beam current density. Furthermore, the emittance of the ion beam can also be controlled by controlling the shape of the boundary 441. Consequently, the beam quality of the extracted ion beam can be well defined for a given particle density and angular distribution.

Figure 5:
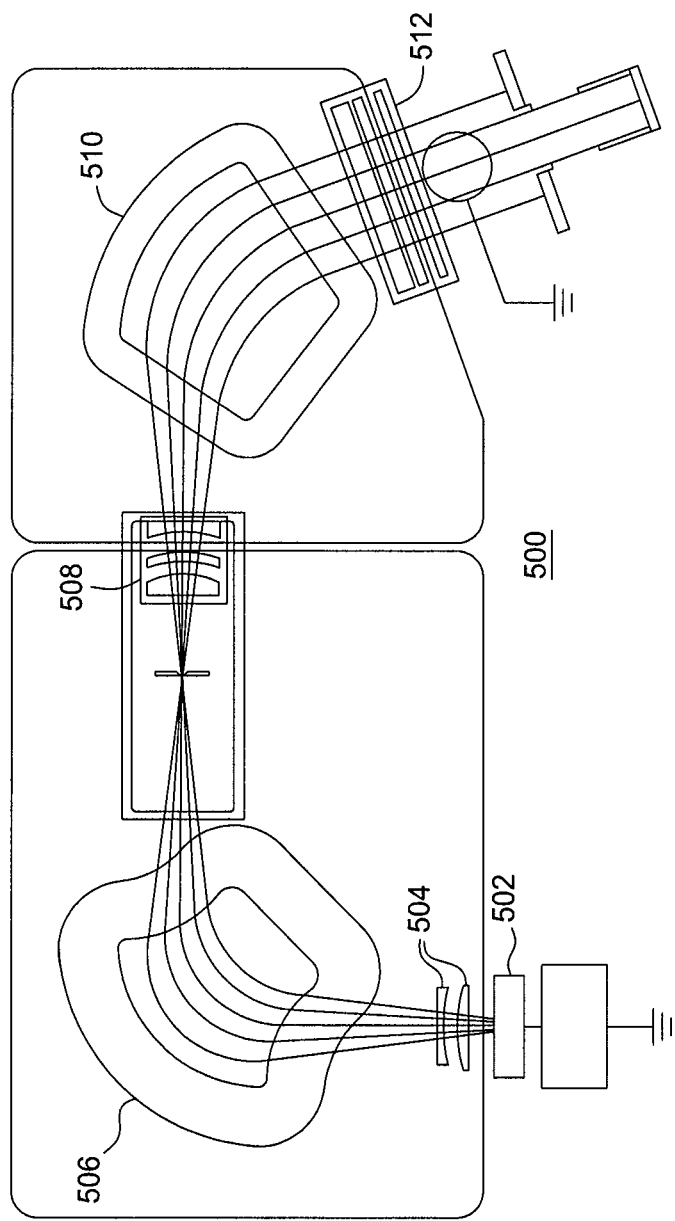
FIG. 5 depicts another embodiment of an apparatus which may be utilized to dope dopants in a structure on a substrate.

FIG. 5 depicts a conventional ion implanting processing chamber 500 that may be utilized to dope ions into certain regions of the substrate. The ion implanting processing chamber 500 includes an ion source 502, extraction electrodes 504, a 90 degree magnet analyzer 506, a first deceleration (D1) stage 508, a magnet analyzer 510, and a second deceleration (D2) stage 512. The deceleration stages D1, D2 (also known as "deceleration lenses") are each comprised of multiple electrodes with a defined aperture to allow an ion beam to pass therethrough. By applying different combinations of voltage potentials to the multiple electrodes, the deceleration lenses D1, D2 can manipulate ion energies and cause the ion beam to hit a target wafer at a desired energy which implants ions into a substrate. The above-mentioned deceleration lenses D1, D2 are typically electrostatic triode (or tetrode) deceleration lenses.

Figure 6:
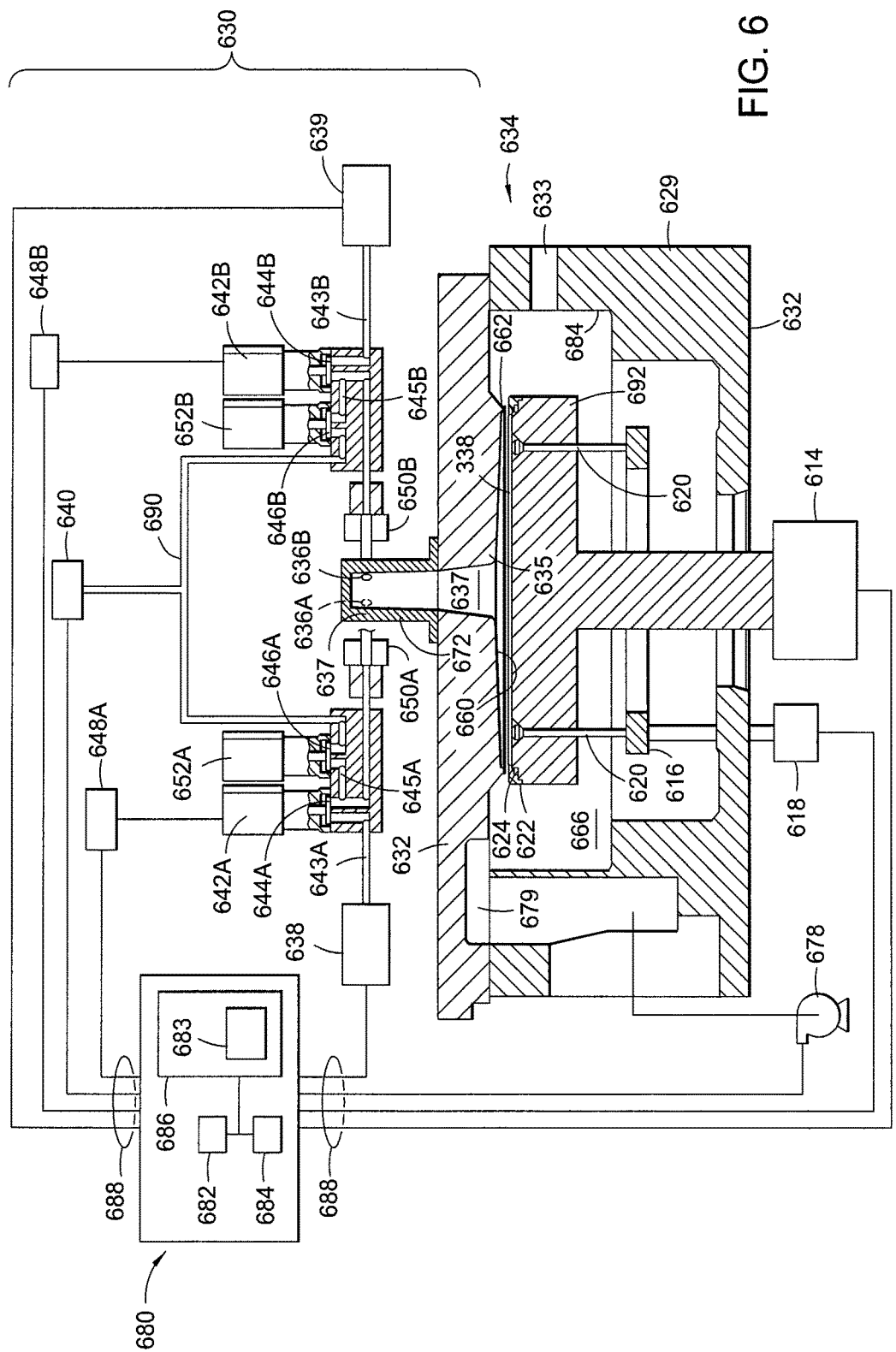
FIG. 6 depict an apparatus that may be utilized to perform an atomic layer deposition (ALD) process.

FIG. 6 is a schematic cross-sectional view of one embodiment of an atomic layer deposition (ALD) processing chamber 634. The ALD processing chamber 634 includes a gas delivery apparatus 630 adapted for cyclic deposition, such as ALD or chemical vapor deposition (CVD). The terms ALD and CVD as used herein refer to the sequential introduction of reactants to deposit a thin layer over a substrate structure. The sequential introduction of reactants may be repeated to deposit a plurality of thin layers to form a conformal layer to a desired thickness. The chamber 634 may also be adapted for other deposition techniques along with lithography process.

The chamber 634 comprises a chamber body 629 having sidewalls 631 and a bottom 632. A slit valve tunnel 633 formed through the chamber body 629 provides access for a robot (not shown) to deliver and retrieve a substrate 338, such as a 200 mm, 300 mm or 450 mm semiconductor substrate or a glass substrate, from the chamber 634.

A substrate support 692 is disposed in the chamber 634 and supports the substrate 338 during processing. The substrate support 692 is mounted to a lift 614 to raise and lower the substrate support 692 and the substrate 338 disposed thereon. A lift plate 616 is connected to a lift plate actuator 618 that controls the elevation of the lift plate 616. The lift plate 616 may be raised and lowered to raise and lower pins 620 movably disposed through the substrate support 692. The pins 620 are utilized to raise and lower the substrate 338 over the surface of the substrate support 692. The substrate support 692 may include a vacuum chuck, an electrostatic chuck, or a clamp ring for securing the substrate 338 to the surface of the substrate support 692 during processing.

The substrate support 692 may be heated to heat the substrate 338 disposed thereon. For example, the substrate support 692 may be heated using an embedded heating element, such as a resistive heater, or may be heated using radiant heat, such as heating lamps disposed above the substrate support 692. A purge ring 622 may be disposed on the substrate support 692 to define a purge channel 624 which provides a purge gas to a peripheral portion of the substrate 338 to prevent deposition thereon.

A gas delivery apparatus 630 is disposed at an upper portion of the chamber body 629 to provide a gas, such as a process gas and/or a purge gas, to the chamber 634. A pumping system 678 is in communication with a pumping channel 679 to evacuate any desired gases from the chamber 634 and to help maintain a desired pressure or a desired pressure range inside a pumping zone 166 of the chamber 634.

In one embodiment, the gas delivery apparatus 630 comprises a chamber lid 632. The chamber lid 632 includes an expanding channel 637 extending from a central portion of the chamber lid 632 and a bottom surface 660 extending from the expanding channel 637 to a peripheral portion of the chamber lid 632. The bottom surface 660 is sized and shaped to substantially cover the substrate 338 disposed on the substrate support 692. The chamber lid 632 may have a choke 662 at a peripheral portion of the chamber lid 632 adjacent the periphery of the substrate 338. The cap portion 672 includes a portion of the expanding channel 637 and gas inlets 636A, 636B. The expanding channel 637 has gas inlets 636A, 636B to provide gas flows from two similar valves 642A, 642B. The gas flows from the valves 642A, 642B may be provided together and/or separately.

In one configuration, valve 642A and valve 642B are coupled to separate reactant gas sources, but are coupled to the same purge gas source. For example, valve 642A is coupled to a reactant gas source 638 and valve 642B is coupled to reactant gas source 639, which both valves 642A, 642B are coupled to purge a gas source 640. Each valve 642A, 642B includes a delivery line 643A, 643B having a valve seat assembly 644A, 644B and includes a purge line 645A, 645B having a valve seat assembly 646A, 646B. The delivery line 643A, 643B is in communication with the reactant gas source 638, 639 and is in communication with the gas inlet 637A, 637B of the expanding channel 690. The valve seat assembly 644A, 644B of the delivery line 643A, 643B controls the flow of the reactant gas from the reactant gas source 638, 639 to the expanding channel 690. The purge line 645A, 645B is in communication with the purge gas source 640 and intersects the delivery line 643A, 643B downstream of the valve seat assembly 644A, 644B of the delivery line 643A, 643B. The valve seat assembly 646A, 646B of the purge line 645A, 645B controls the flow of the purge gas from the purge gas source 640 to the delivery line 643A, 643B. If a carrier gas is used to deliver reactant gases from the reactant gas source 638, 639, the same gas may be used as a carrier gas and a purge gas (i.e., an argon gas may be used as both a carrier gas and a purge gas).

Each valve 642A, 642B may be a zero dead volume valve to enable flushing of a reactant gas from the delivery line 643A, 643B when the valve seat assembly 644A, 644B of the valve is closed. For example, the purge line 645A, 645B may be positioned adjacent the valve seat assembly 644A, 644B of the delivery line 643A, 643B. When the valve seat assembly 644A, 644B is closed, the purge line 645A, 645B may provide a purge gas to flush the delivery line 643A, 643B. In the embodiment shown, the purge line 645A, 645B is positioned as slightly spaced from the valve seat assembly 644A, 644B of the delivery line 643A, 643B so that a purge gas is not directly delivered into the valve seat assembly 644A, 644B when open. A zero dead volume valve as used herein is defined as a valve which has negligible dead volume (i.e., not necessary zero dead volume.) Each valve 642A, 642B may be adapted to provide a combined gas flow and/or separate gas flow of the reactant gas 638, 639 and the purge gas 640. The pulses of the purge gas may be provided by opening and closing a diaphragm of the valve seat assembly 646A of the purge line 645A. The pulses of the reactant gas from the reactant gas source 638 may be provided by opening and closing the diaphragm valve seat 644A of the delivery line 643A.

A control unit 680 may be coupled to the chamber 634 to control processing conditions. The control unit 680 comprises a central processing unit (CPU) 682, support circuitry 684, and memory 686 containing associated control software 683. The control unit 680 may be one of any form of general purpose computer processors that can be used in an industrial setting for controlling various chambers and subprocessors. The CPU 682 may use any suitable memory 686, such as random access memory, read only memory, floppy disk drive, compact disc drive, hard disk, or any other form of digital storage, local or remote. Various support circuits may be coupled to the CPU 682 for supporting the chamber 634. The control unit 680 may be coupled to another controller that is located adjacent individual chamber components, such as the programmable logic controllers 648A, 648B of the valves 642A, 642B. Bi-directional communications between the control unit 680 and various other components of the chamber 634 are handled through numerous signal cables collectively referred to as signal buses 688, some of which are illustrated in FIG. 6. In addition to the control of process gases and purge gases from gas sources 638, 639, 640 and from the programmable logic controllers 648A, 648B of the valves 642A, 642B, the control unit 680 may be configured to be responsible for automated control of other activities used in substrate processing, such as substrate transport, temperature control, chamber evacuation, among other activities, some of which are described elsewhere herein.

Figure 7:
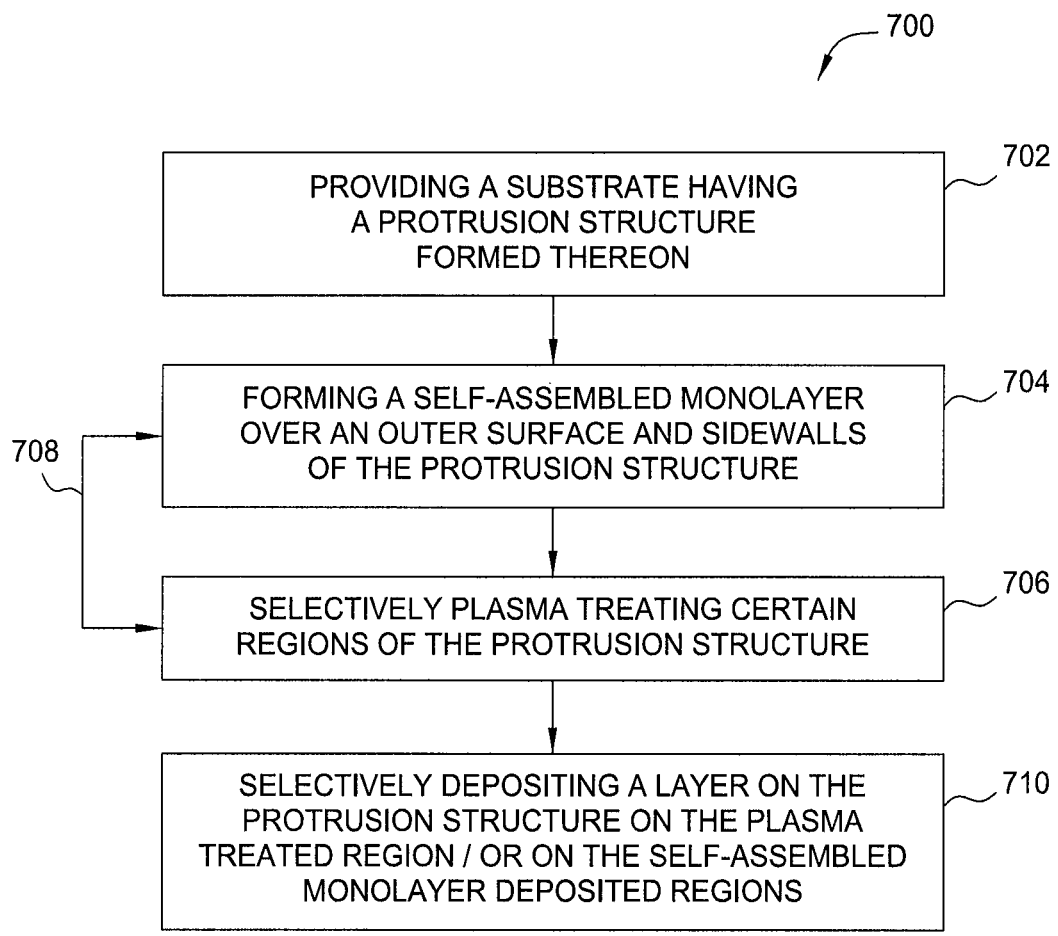
FIG. 7 depicts a flow diagram of a method for form fin structures with composite materials on a substrate.

FIG. 7 is a flow diagram of one embodiment of a selective deposition process that may be performed to form different materials on different locations of a structure formed on a substrate. The structure may be a three dimensional protrusion structure extending outward from the substrate, such as a fin structure, a gate structure, a contact structure, or any other suitable structures utilized in semiconductor applications. FIGS. 8A-8D are schematic cross-sectional views of a portion of a composite substrate corresponding to various stages of the process 700. The process 700 may be utilized to form fin structures on a substrate having desired materials formed on different locations of the fin structure which may later be utilized to form a fin field effect transistor (FinFET) for three dimensional (3D) stacking of semiconductor chips. Alternatively, the process 700 may be beneficially utilized to etch other types of structures.

The process 700 begins at block 702 by providing a substrate, such as the substrate 338 depicted in FIGS. 3A-6, having a plurality of structures 802, such as fin structures 804, formed thereon, as shown in FIG. 8A. In one embodiment, the substrate 338 may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 338 may have various dimensions, such as 200 mm, 300 mm, 450 mm or other diameter, as well as, being a rectangular or square panel. Unless otherwise noted, embodiments and examples described herein are conducted on substrates with a 200 mm diameter, a 300 mm diameter, or a 450 mm diameter substrate. In the embodiment wherein a SOI structure is utilized for the substrate 338, the substrate 338 may include a buried dielectric layer disposed on a silicon crystalline substrate. In the embodiment depicted herein, the substrate 338 may be a crystalline silicon substrate. Moreover, the substrate 338 is not limited to any particular size or shape. The substrate 338 may be a round substrate having a 200 mm diameter, a 300 mm diameter or other diameters, such as 450 mm, among others. The substrate 238 may also be any polygonal, square, rectangular, curved or otherwise non-circular workpiece, such as a polygonal glass substrate used in the fabrication of flat panel displays.

The fin structures 804 may be a structure extending outward and protruding from the substrate 338. The fin structure 804 has sidewalls 806 (shown as a first sidewall 806a and a second sidewall 806b in FIG. 8A), which terminate at a top surface 808. In one embodiment, the fin structures 804 may be formed in the substrate 338 by etching the substrate 338 to form recess structures 805 between the fin structures 804. A portion of the recess structures 805 is then filled with insulating materials to form shallow trench isolation (STI) structures (not shown in the drawings for ease of illustration) so as to facilitate forming the fin structures 804 therebetween for the fin field effect transistors (FinFET) manufacture process. As the fin structure 804 is formed by etching the substrate 338, thus, the fin structure 804 may be of the same material as the substrate 338, which may be a silicon containing material. In the embodiment depicted herein, the substrate 338 is a silicon substrate so that the fin structure 804 formed therefrom is also a silicon material.

In one embodiment, the insulating material utilized to form the shallow trench isolation (STI) structures may be a dielectric material, such as silicon oxide material. The insulating material may be formed by a plasma enhanced chemical vapor deposition (CVD), a flowable chemical vapor deposition (CVD), a high density plasma (HDP) chemical vapor deposition (CVD) process, atomic layer deposition (ALD), cyclical layer deposition (CLD), physical vapor deposition (PVD), or the like as needed. In one embodiment, the insulating material is formed by a flowable or plasma enhanced chemical vapor deposition (CVD).

It is noted that the profile of the fin structures 804 formed in the substrate 338 may have different forms, including sidewalls 806 that are substantially straight, flared out, upward tapered or downward tapered-down, or angled profiles, special sidewall features, overhang or undercut structures, or other profiles as needed.

Figure 1A:
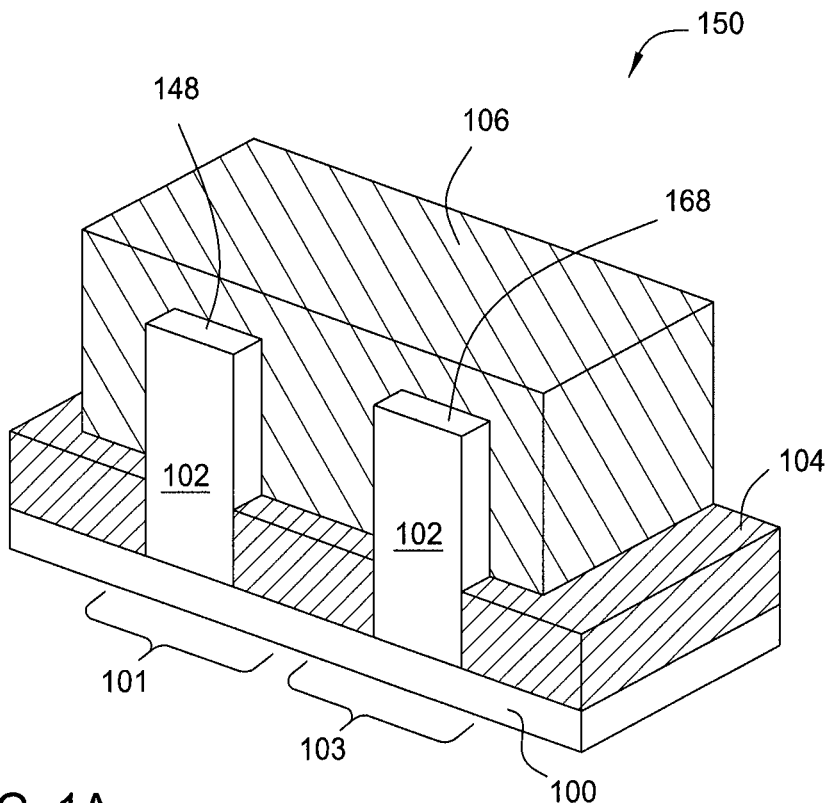
FIG. 1A depicts a schematic perspective view of a substrate having a fin field effect transistor (FinFET) structure formed thereon in a conventional manner.
Figure 1B:
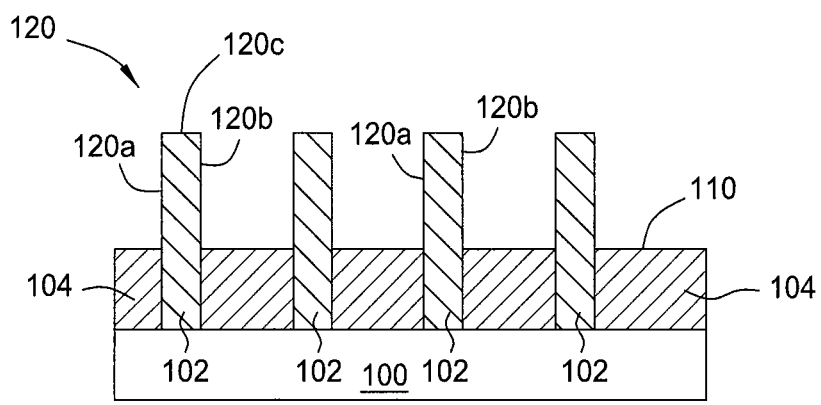
FIG. 1B depicts a cross sectional view of a substrate having a portion of the fin field effect transistor (FinFET) structure formed thereon in a conventional manner.

At block 704, a self assembled monolayer (SAM) deposition process may be performed to form self assembled monolayers 810 on the circumference, e.g., outer surface, of the substrate 338, including the top surface 810, sidewalls 806 and a surface 811 of the substrate 338, as shown in FIG. 8B1. Self assembled monolayers (SAM) are ordered molecular assemblies formed by adsorption of molecules on the substrate surface. Self assembled monolayers (SAM) are thin organic (or inorganic in rare cases) films which form spontaneously on solid surfaces. By proper selection of the precursors, the self assembled monolayers 810 with desired film properties may be adsorbed and formed on the substrate, which may later serve as an initiation layer/nucleation layer for the subsequent deposition process, such as an atomic layer deposition (ALD) process. In one embodiment, the self assembled monolayers 810 may be used for modification of surface properties, including wetting, adhesion, friction, chemical sensing, ultrafine scale lithography, and protection from metal corrosions. By modification of the surface properties, a surface chemical reaction may occur, enhancing absorption of molecules provided during the formation of the self assembled monolayers 810. The self assembled monolayers 810 has a first part, called "head group", which absorb on the substrate surface and a second part, called "terminal group", which are exposed to later react and adhere with the subsequent molecules supplied from new precursors present later in the deposition process. The head group and the terminal group may be connected by alkyl chain. In the embodiment depicted herein, the head group performs a chemical interaction with the surface of the fin structure 804 from the substrate 338, absorbing at surface sites, resulting in a close-packed monolayer. The terminal group from the self assembled monolayers 810 may modify surface properties, ranging from reactive, high energies to passive, low energies, for chemical sensing, passivation, hydrophobicity, adhesion promotion, and corrosion protection.

In one embodiment, the self assembled monolayer (SAM) deposition process may be performed by dipping, immersing, spraying, soaking, flooding, or rinsing the substrate with a solution based (e.g., liquid based) precursor. In some embodiments, a vapor process may be utilized to expose the substrate to a precursor in gas phase. In the embodiment wherein the self assembled monolayers (SAM) 810 are desired to form on three-dimensional structures, such as the fin structure 804 depicted in FIGS. 8A-8D, a vapor process may be performed as the vapor process may eliminate the likelihood of aggregation occurring at different locations of the structures, which may be a problem in a liquid-phase process. The vapor deposition may be performed in a vacuum system, which may be integrated with the ALD processing chamber utilized to perform an ALD process, which will be described later at block 710, after the self assembled monolayer (SAM) deposition process at block 704 is performed and completed.

In one embodiment, suitable examples of the precursors utilized to perform the self assembled monolayer (SAM) deposition process includes precursors having head groups as alkanethiols, [X—(CH$_2$)$_n$—SH], which X are any suitable compounds, which are formed on metal surface, such as Ag, Au, Cu or Al, or alkyltrichlorosilanes [X—(CH$_2$-n-SiCl$_3$) formed on dielectric surfaces, such as SiO$_2$, Al$_2$O$_3$, Si, or other oxides. The precursors used during the self assembled monolayer (SAM) deposition process may modify hydrophobicity of the surface where they are attached onto.

It is noted that the self assembled monolayers (SAM) 810 formed on the substrate 338 may provide ordered structures that may act as a template for the growth of thin layers later to be formed thereon at block 710. The self assembled monolayers (SAM) 810 may be used to engineer the properties of the interface of the original substrate, so as to promote the deposition process subsequently performed thereon at block 710.

At block 706, a directional plasma process (or a ion doping/implantation process) is performed to dope, coat, treat, implant, insert or modify certain film/surface properties on certain locations of fin structure 804 with dopants formed into the fin structures 804, as shown in FIG. 8C1-1, Figure C1-2 and FIG. C1-3. The directional plasma process utilizes directional and/or incident ions with particular selected angles to predominantly modify film/surface properties on predominantly a portion of the self assembled monolayers (SAM) 810, mainly the first sidewall 806a of the fin structure 804, with dopants doped thereto to form a treated layer 814 in some parts of the self assembled monolayers (SAM) 810, forming patterned self assembled monolayers (SAM) 809 having the treated layer 814 from on the first sidewall 806a of the fin structure 804 and the untreated portion and/or the original untreated self assembled monolayers (SAM) 810, remain on the second sidewall 806b of the fin structure 804. Although the example described here illustrating the directional plasma process dope ions onto the self assembled monolayers (SAM) 810 on the first sidewall 806a of the fin structure, it is noted that the ions may be doped to any desired locations of the fin structure 804 as needed to locally and selectively change surface properties.

The directional plasma process may be performed in a directional plasma processing chamber, such as the processing chamber 300, 400, 500 depicted in FIG. 3A-3B, 4 or 5, or other suitable conventional ion implantation/doping processing tool that may provide a heated substrate. The directional plasma process is performed by implanting ions 818, as shown in FIG. 8C1-1, with desired incident angles, to a selected region, such as the first sidewall 806a, of the fin structures 804. The ions, which include a desired type of atoms, may be doped into the self assembled monolayers (SAM) 810 on the first sidewall 806a, forming the treated layer 814 on the first sidewalls 806a of the fin structure 804, leaving another portion of the self assembled monolayers (SAM) 810 formed on the second sidewall 806b unchanged or untreated. In another embodiment depicted in FIG. 8C1-2, the ions 818 may be implanted/doped into predominately the first sidewall 806a and the bottom 830 of the fin structure 804. In yet another embodiment depicted in FIG. 8C1-3, the ions 818 may be implanted/doped into predominately the top surface 808 and the bottom 830 of the fin structure 804. The ions doped into the treated layer 814 may modify the film/surface properties of the self assembled monolayers (SAM) 810, which may affect, weaken, or alter the chemical reaction and/or absorbability of the molecular to be later adsorbed or reacted therewith during the subsequent deposition process, thereby enabling a selective deposition process that only allows deposition occurred on predominately certain regions, untreated region of the self assembled monolayers (SAM) 810 remained of the substrate 338.

In one embodiment, the ions 818 generated from the directional plasma process, or the ion implantation/doping process, are configured to have an incident angle between about 0 degrees and about 60 degrees. With the desired and predetermined incident and directional angles, the ions 818 may mainly be implanted into the predetermined regions, the first sidewall 806a of the fin structure 804, with controlled doping incident angles, rather than only from the top surface 808 of the fin structure 804 or globally formed everywhere on the substrate, as conventional doping/implantation processes typically do. By doing so, some desired regions, such as the second sidewall 806b, of the fin structure 804 that is not intended to be doped, plasma treated, or deposited during the directional plasma process, may be selectively and/or intentionally left out during (i.e., not subject to) the directional plasma process, so as to form the patterned self assembled monolayer (SAM) 809.

The directional plasma process may alter the fin structure 804 to form the treated layer 814 to form desired doping profile as needed, providing the treated layer 814 with altered film properties that enable obtaining different process results during the subsequent deposition process.

In one embodiment, the directional plasma process may be performed for a period of time between about 1 seconds and about 180 seconds until the patterned self assembled monolayer (SAM) 809 is formed on the substrate 338 resulting in desired treated region, the treated layer 814 formed on the first sidewall 806a, and the untreated region, the unchanged self assembled monolayer (SAM) 810, remaining on the second sidewall 806b. Alternatively, the directional plasma process may be performed for a period of time until a doping concentration of between about 1E15 ions/cm$^2$ and about 5E16 ions/cm$^2$ is formed in the treated layer 814.

Alternatively, the directional plasma process may be performed to strike ions 818 at a first angle at a first location of the fin structure 804 and then strike ions 818 at a second angle as needed at a second location of the same fin structure 804 until the self assembled monolayer (SAM) 810 formed a desired pattern therein which may be later used as a template to selectively deposit a material layer thereon with the desired pattern. Striking ions at different incident and at different locations may be used where the structures 802 formed on the substrate 338 has different aspect ratios, geometry, critical dimensions, width, length, or pattern density. By doing so, the resulting structure may be formed with one face that is more robust, e.g., having different surface morphology or surface properties, than another face.

In one embodiment, the directional plasma process may be performed that utilizes a moving stage to support and move the substrate 338 to expose the structures 802 at different angles with respect to the incident ions 818. The moving stage and the substrate 338 disposed thereon relative to the angled ion beams allows for an interactive ion scanning/treating process that enables certain area of the substrate 338 to be linearly, circularly, or regularly treated at a predetermined mode continuously or repetitively.

Several process parameters may be controlled during the directional plasma process. The directional plasma process may be performed by supplying a gas mixture into the processing chamber. The ion doping gas mixture may be supplied into the processing chamber at a flow rate between about 10 sccm and about 200 sccm. Suitable gases for supplying in the ion doping gas mixture include AsH$_3$, GaH$_3$, SiH$_4$, SiF$_4$, GeH$_4$, GeF$_4$, CH$_4$, CF$_4$, AsF$_5$, PF$_3$, PF$_5$, $B_2H_6$, $BH_3$ and the like. Inert gas, such as Ar, He, Kr, Ne or the like, or carrier gases, such as $H_2$, $N_2$, $N_2O$, $NO_2$, or the like, may also be supplied into the gas mixture. The chamber pressure is generally maintained between about 0.1 mTorr and about 100 mTorr, such as about 10 mTorr. A RF power, such as capacitive or inductive RF power, DC power, electromagnetic energy, or magnetron sputtering, may be supplied into the processing chamber 200 to assist dissociating the gas mixture during processing. Ions generated by the dissociative energy may be accelerated toward the substrate using an electric field produced by applying a DC or RF electrical bias to the substrate support or to a gas inlet above the substrate support, or both. In some embodiments, the ions may be subjected to a mass selection or mass filtration process, which may comprise passing the ions through a magnetic field aligned orthogonal to the desired direction of motion. The electric field provided by the RF power may be capacitively or inductively coupled for purposes of ionizing the atoms, and may be a DC discharge field or an alternating field, such as an RF field. Alternately, microwave energy may be applied to the ion implanting gas mixture containing any of these elements to generate ions. In some embodiments, the gas containing energetic ions may be a plasma. An electrical bias (peak to peak voltage) of between about 50 V and about 10000 V, such as about 4000V is applied to the substrate support, the gas distributor, or both, to accelerate the ions toward the substrate surface with the desired energy. In some embodiments, the electrical bias is also used to ionize the ion implantation processing gas. In other embodiments, a second electric field is used to ionize the process gas. In one embodiment, a RF field with a frequency of about 2 MHz is provided to ionize the ion implantation processing gas and bias the substrate support at a power level between about 100 W and about 10000 W. The ions thus produced will generally be accelerated toward the substrate by biasing the substrate or a gas distributor as described above.

In some embodiments, the power used to generate ions may be pulsed. Power may be applied to the plasma source for a desired time, and then discontinued for a desired time. Power cycling may be repeated for a desired number of cycles at a desired frequency and duty cycle. In some embodiments, the plasma may be pulsed at a frequency between about 1 Hz and about 50,000 Hz, such as between about 5000 Hz and about 10000 Hz. In other embodiments, the plasma pulsing may proceed with a duty cycle (ratio of powered time to unpowered time per cycle) between about 10% and about 90%, such as between about 30% and about 70%. In one embodiment, the RF source power may be supplied at between about 100 Watts to about 5000 Watts and the bias power may be supplied at between about 50 Watts and about 11000 Watts. The process temperature may be controlled at between about 5 degrees Celsius and about 650 degrees Celsius.

At block 710, after the directional plasma process or ion doping/implantation process, an atomic layer deposition process may be performed to selectively deposit a material layer 820 on the substrate 338 predominantly on the untreated region, original region, of the self assembled monolayer (SAM) 810 on the substrate 338, as shown in FIG. 8D1, FIG. 8D2 or FIG. 8D3 using the patterned self assembled monolayer (SAM) 810 as a template depicted in FIG. 8C1-1, FIG. 8C1-2, or FIG. 8C1-3 respectively. As discussed above, the terminal group from the self assembled monolayer (SAM) 810 may successfully absorb and react with the molecular supplied during the ALD process so as to grab atoms from each pulse of the ALD process to enable the growth and continuous deposition of the material layer 820. The patterned self assembled monolayer (SAM) 809 serves as a template to allow the material layer 820 to be selectively formed on the intended region, on the second sidewall 806a, of the fin structure 804 so as to form a fin structure with different materials formed on different regions of the fin structure for different device requirements.

As ALD process is sensitive to surface conditions, the process 700 is an ideal method for a selective deposition of the material layer 820 on the patterned self assembled monolayer (SAM) 809. Atomic layer deposition (ALD) process is a chemical vapor deposition (CVD) process with self-terminating/limiting growth. The ALD process yields a thickness of only a few angstroms or in a monolayer level. The ALD process is controlled by distribution of a chemical reaction into two separate half reactions which are repeated in cycles. The thickness of the material layer 820 formed by the ALD process depends on the number of the reaction cycles. The first reaction provides a first atomic layer of molecular layer being absorbed on the substrate and the second reaction provide a second atomic layer of molecular layer being absorbed on the first atomic layer. As such, the ordered structure of the monolayers from the patterned self assembled monolayer (SAM) 809 acts as a template for the growth of the structured material layer 820. The treated layer 814 formed from the patterned self assembled monolayer (SAM) 809 serves as growth-preventing masks that prohibit deposition of the ALD process on the first sidewall 806a of the fin structure 804, while the untreated/unchanged self assembled monolayer (SAM) 810 serves as an initiation seed/nucleation layer that allows ALD deposition process to nucleate and grow on the nucleate sites provided from the self assembled monolayer (SAM) 810 remaining on the substrate 338. Thus, the selective ALD deposition process only grow material layer 820 on designated sites only, i.e., the self assembled monolayer (SAM) 810 that remain on the second sidewall 806b of the fin structure 804.

During the ALD deposition process, a pulse of a first reactant gas mixture is supplied into the processing chamber, such as the processing chamber 634 depicted in FIG. 6, to form a first monolayer the material layer 820 on the second sidewall 806b of the fin structure 804. It is believed that the first monolayer is absorbed onto the untreated/unchanged self assembled monolayer (SAM) 810 remaining on the substrate by a chemical reaction that allows the atoms from the first monolayer to be securely adhered on the atoms from the untreated/unchanged self assembled monolayer (SAM) 810. Since the treated layer 814 from the patterned untreated/unchanged self assembled monolayer (SAM) 809 may have chemical properties different from the untreated/unchanged self assembled monolayer (SAM) 810, the molecules in the treated layer 814 may not be able to successfully adhere the atoms from the first monolayer of the material layer 820, thereby only allowing the atoms from the first monolayer to be adhered on the atoms of the untreated/unchanged self assembled monolayer (SAM) 810. In this way, the subsequently formed second monolayer only selectively deposits on the first monolayer, thus enabling a selective deposition of an ALD process.

During the pulsing of the first reactant gas mixture, the first reactant gas mixture may be supplied simultaneously with, sequentially with, or alternatively without a reducing gas mixture ("reagent"), such as a hydrogen gas ($H_2$) or a $NH_3$ gas, into the processing chamber 634 during a thermal ALD process or a plasma ALD process as needed. A suitable first reactant gas mixture that may be supplied into the processing chamber 634 may include a silicon containing gas, such as SiH$_4$, Si$_2$H$_6$, or other suitable silicon containing compounds, and one or more of a tantalum containing gas, titanium containing gas, cobalt containing gas, tungsten containing gas, aluminum containing gas, nickel containing gas, copper containing gas, boron containing gas, phosphorus containing gas, nitrogen containing gas, or other suitable gases that may deposit a monolayer on the substrate surface suitable for using in semiconductor devices. Examples of the alternative reagents (i.e., reducing agents used with reactant precursors for forming the monolayer during the deposition process) as described herein may include hydrogen (e.g., H$_2$ or atomic-H), nitrogen (e.g., N$_2$ or atomic-N), ammonia (NH$_3$), hydrazine (N$_2$H$_4$), a hydrogen and ammonia mixture (H$_2$/NH$_3$), borane (BH$_3$), diborane (B$_2$H$_6$), triethylborane (Et$_3$B), silane (SiH$_4$), disilane (Si$_2$H$_6$), trisilane (Si$_3$H$_8$), tetrasilane (Si$_4$H$_{10}$), methyl silane (SiCH$_6$), dimethylsilane (SiC$_2$H$_8$), phosphine (PH$_3$), derivatives thereof, plasmas thereof, or combinations thereof.

The first reactant gas mixture pulse lasts for a predetermined time interval. The term pulse as used herein refers to a dose of material injected into the process chamber. Between each pulse of the first reactant gas mixture or of the first and a second reactant gas mixture, which will be discussed further below, the purge gas mixture may be pulsed into the processing chamber in between each or multiple pulses of the first and/or second reactant precursor gas mixture to remove the impurities or residual precursor gas mixture which is unreacted/non-absorbed by the substrate surface (e.g., unreacted impurities from the reactant gas mixture or others) so they can be pumped out of the processing chamber.

Each pulse of the first reactant precursor gas mixture pulsed into the processing chamber 634 may deposit the first monolayer of the material layer 820 having a thickness between about 3 Å and about 5 Å.

During pulsing of the first reactant precursor gas mixture, several process parameters are also regulated. In one embodiment, the process pressure is controlled at between about 7 Torr and about 30 Torr. The processing temperature is between about 125 degrees Celsius and about 450 degrees Celsius. The RF power may be controlled at between about 100 watts and about 2000 watts. The reactant gas supplied in the first reactant gas mixture may be controlled at between about 5 sccm and about 10 sccm. The reducing gas may be supplied at between about 100 sccm and about 700 sccm.

After termination of the pulse of the first reactant gas, a pulse of a second reactant gas mixture is supplied into the processing chamber 634 to form a second monolayer of the material layer 820 predominantly on the second sidewall 806b of the fin structure 804. The second reactant gas mixture may be supplied simultaneously with, sequentially with, or alternatively without a reducing gas mixture (or reagent), such as a hydrogen gas (H$_2$) or a NH$_3$ gas, into the processing chamber 634 during a thermal ALD process or a plasma ALD process as needed. It is believed that the second monolayer is absorbed onto the first monolayer by a chemical reaction to allow the atoms from the second monolayer to be securely adhered on the atoms from the first monolayer.

In one embodiment, a suitable second reactant gas mixture that may be supplied into the processing chamber 634 may include a silicon containing gas, such as SiH$_4$, Si$_2$H$_6$, or other suitable silicon containing compounds, and one or more of oxygen containing gas, such as H$_2$O, O$_2$, or O$_3$, tantalum containing gas, titanium containing gas, cobalt containing gas, tungsten containing gas, aluminum containing gas, nickel containing gas, copper containing gas, boron containing gas, phosphorus containing gas, nitrogen containing gas, or other suitable gases that may deposit a monolayer on the substrate surface suitable for using in semiconductor devices. Examples of the alternative reagents (i.e., reducing agents used with reactant precursors for forming the monolayer during the deposition process) as described herein may include hydrogen (e.g., H$_2$ or atomic-H), nitrogen (e.g., N$_2$ or atomic-N), ammonia (NH$_3$), hydrazine (N$_2$H$_4$), a hydrogen and ammonia mixture (H$_2$/NH$_3$), borane (BH$_3$), diborane (B$_2$H$_6$), triethylborane (Et$_3$B), silane (SiH$_4$), disilane (Si$_2$H$_6$), trisilane (Si$_3$H$_8$), tetrasilane (Si$_4$H$_{10}$), methyl silane (SiCH$_6$), dimethylsilane (SiC$_2$H$_8$), phosphine (PH$_3$), derivatives thereof, plasmas thereof, or combinations thereof.

The pulse of the second reactant gas mixture lasts for a predetermined time interval. Between each pulse or a number of pulses of the second reactant gas mixture or of the first and the second reactant gas mixture, the purge gas mixture may be pulsed into the processing chamber to remove the impurities or residual precursor gas mixture which is unreacted/non-absorbed by the substrate surface (e.g., unreacted impurities from the reactant gas mixture or others).

Each pulse of the second reactant precursor gas mixture pulsed into the processing chamber 634 may deposit the second monolayer of the material layer 820 having a thickness between about 3 Å and about 5 Å.

During pulsing of the second reactant precursor gas mixture, several process parameters are also regulated. In one embodiment, the process pressure is controlled at between about 5 Torr and about 30 Torr. The processing temperature is between about 125 degrees Celsius and about 450 degrees Celsius. The RF power may be controlled at between about 100 watts and about 800 watts. The reactant gas supplied in the second reactant gas mixture may be controlled at between about 5 sccm and about 20 sccm. The reducing gas may be supplied at between about 100 sccm and about 700 sccm.

In between each or after several pulses of reactant precursor gas mixtures, a purge gas mixture is then supplied into the processing chamber 634 to purge out the residuals and impurities from the processing chamber. Several process parameters are also regulated during pulsing of the purge gas mixture. In one embodiment, the process pressure is controlled at between about 1 Torr and about 100 Torr. The processing temperature is between about 125 degrees Celsius and about 450 degrees Celsius. The RF power may be controlled at between about 100 watts and about 800 watts. The Ar or N$_2$ gas may be supplied at between about 200 sccm and about 1000 sccm.

Subsequent to the pulse of the purge gas mixture, additional cycles starting from the pulsing of the first and/or second reactant gas mixtures followed by the pulse of the purge gas mixture can then be repeatedly performed until a desired thickness of the material layer 820 is obtained. When a subsequent cycle of pulsing the first reactant gas mixture starts, the process pressure and other process parameters may be regulated to the predetermined level to assist depositing a subsequent monolayer of the material layer 820.

In another embodiment, the self-assembled monolayer deposition process at block 704 and the directional plasma process at block 706 may be performed in a reversed order, as indicated by the arrow 708 to perform the directional plasma process at block 706 prior to the self-assembled monolayer deposition process at block 704. In this embodiment, a directional plasma treatment process may be first performed to form the first treated layer 814 on the first sidewall 806a of the fin structure 804 as shown in FIG.

Figure 2A:
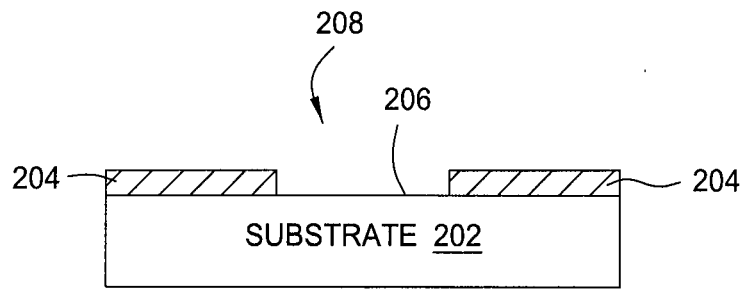
FIGS. 2A-2C depicts a process flow for utilizing self assembled monolayers (SAM) to perform a conventional selective deposition process.
Figure 2B:
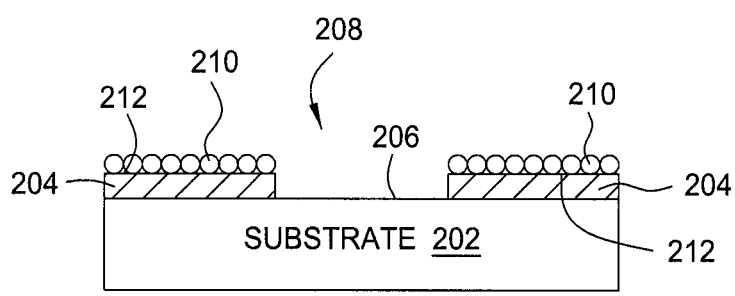
Figure 2C:
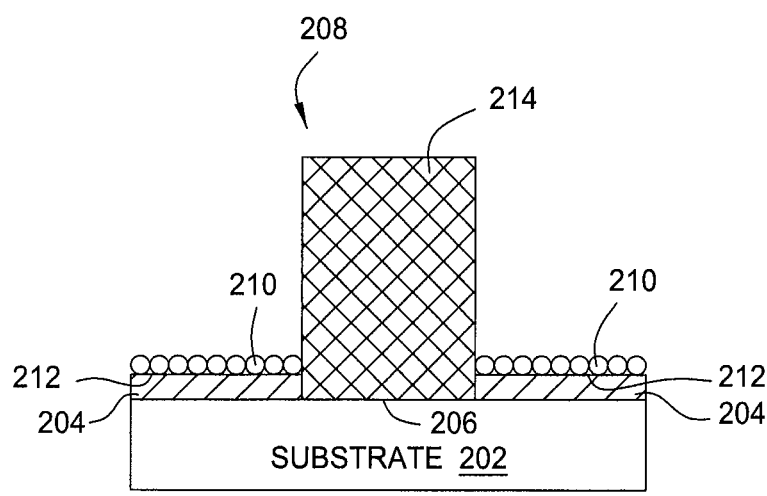

8B2-1, or on the first sidewall 806a and the bottom 830 of the fin structure 804, as shown in FIG. 8C2-2 or on predominantly the top surface 808 and the bottom 830 of the fin structure 804 as shown in FIG. 8C2-3 respectively. The directional plasma process may provide incident ions 812 to selectively dope, insert, coat, implant or treat ions 812 to form the treated layer 814 directly on the substrate 338. Subsequently, the self-assembled monolayer deposition process at block 704 is then performed to form the self-assembled monolayer (SAM) 810 predominantly and selectively on the second sidewall 806b and the bottom 830 of the fin structure 804 without on the treated layer 814 as shown in FIG. 8C2-1, or predominately on the second sidewall 806b of the fin structure 804 as shown in FIG. 8C2-2, or predominately on the first sidewall 806a and the second sidewall 806b of the fin structure 804 as shown in FIG. 8C2-3. For the same reasons above, the molecules from the self-assembled monolayer 810 may predominantly only adhere onto the substrate, without adsorbing onto the treated layer 814, by a careful selection of precursors utilized to form the self-assembled monolayer 810. As such, after a patterned self-assembled monolayer 809 is formed, then the ALD deposition process at block 710 is then performed to form the material layer 820 selectively on the second sidewall 806b of the fin structure wherein the self-assembled monolayer 810 is formed, for the similar reasons described above. as shown in FIG. 8D1, FIG. 8D4 and FIG. 8D5 using the patterned self-assembled monolayer 810 as a template from FIG. 8C2-1, Figure C2-2 and FIG. 8C2-3 respectively.

Thus, methods for forming a selective ALD deposition process by utilizing a patterned self-assembled monolayer are provided to form a structure on a substrate with different materials on different regions of the structure, such as a fin structure for three dimensional (3D) stacking of fin field effect transistor (FinFET) for semiconductor chips are provided. The methods utilize a directional plasma process to form a patterned self-assembled monolayer si as to enable a selective ALD process to form a material layer on a structure of a substrate with different materials on different surfaces/sidewall of the structure. Thus, a fin structure with desired different type of materials formed on different locations in the structure, such as a fin structure, may be obtained, particularly for applications in three dimensional (3D) stacking of semiconductor fin field effect transistors (FinFET).

While the foregoing is directed to embodiments of the present invention, other and further embodiments of the invention may be devised without departing from the basic scope thereof, and the scope thereof is determined by the claims that follow.

The invention claimed is:

1. A method of forming a fin structure with different materials on different sidewalls on a substrate comprising:
   forming a self-assembled monolayer exclusively on a first portion of a fin structure disposed on a substrate;
   performing a directional plasma process to form a treated layer on a second portion of the fin structure; and
   performing an atomic layer deposition process to selectively form a material layer predominantly on the self-assembled monolayer, leaving the second portion of the fin structure free of the material layer.

2. The method of claim 1, wherein performing the directional plasma process further comprises:
   performing the directional plasma process to predominantly dope ions into a first sidewall of the second portion of the fin structure, forming the treated layer predominantly on the first sidewall of the second portion of the fin structure.

3. The method of claim 2, wherein the self-assembled layer is predominately formed on a second sidewall of the first portion of the fin structure.

4. The method of claim 2, wherein performing the directional plasma process further includes:
   doping the ions into the first sidewall of the second portion of the fin structure with an ion incident angle of between about 0 degrees and 60 degrees.

5. The method of claim 1, further comprising:
   leaving the self-assembled layer formed on the first portion of the fin structure substantially unchanged without ion doping.

6. The method of claim 1, the structure is a fin structure used in three-dimensional stacking of fin field effect transistor (FinFET) for semiconductor chips.

* * * * *

UNITED STATES PATENT AND TRADEMARK OFFICE
CERTIFICATE OF CORRECTION

PATENT NO. : 9,911,594 B2  
APPLICATION NO. : 15/346306  
DATED : March 6, 2018  
INVENTOR(S) : Srinivas D. Nemani et al.

Page 1 of 1

It is certified that error appears in the above-identified patent and that said Letters Patent is hereby corrected as shown below:

In the Specification

In Column 5, Line 67, delete "Bl$_3$N$_2$," and insert -- BI$_3$N$_2$, --, therefor.

In Column 7, Line 39, delete "Bl$_3$N$_2$," and insert -- BI$_3$N$_2$, --, therefor.

In Column 19, Line 2, delete "8C2-2" and insert -- 8B2-2 --, therefor.

In Column 19, Line 4, delete "8C2-3" and insert -- 8B2-3 --, therefor.

Signed and Sealed this  
First Day of May, 2018

Andrei Iancu  
*Director of the United States Patent and Trademark Office*